US 11,679,489 B2

(12) United States Patent
Fukuda et al.

(10) Patent No.: US 11,679,489 B2
(45) Date of Patent: Jun. 20, 2023

(54) SAMPLE CHIP WORKTABLE AND RETAINER

(71) Applicant: JEOL Ltd., Tokyo (JP)

(72) Inventors: Tomohisa Fukuda, Tokyo (JP); Yuji Konyuba, Tokyo (JP); Yuuta Ikeda, Tokyo (JP); Tomohiro Haruta, Tokyo (JP)

(73) Assignee: JEOL Ltd., Tokyo (JP)

( * ) Notice: Subject to any disclaimer, the term of this patent is extended or adjusted under 35 U.S.C. 154(b) by 334 days.

(21) Appl. No.: 17/030,598

(22) Filed: Sep. 24, 2020

(65) Prior Publication Data

US 2021/0094166 A1     Apr. 1, 2021

(30) Foreign Application Priority Data

Sep. 30, 2019  (JP) .............................. JP2019-178460

(51) Int. Cl.
  *B25H 1/10*   (2006.01)
  *G02B 21/34*  (2006.01)
  *H01J 37/20*  (2006.01)

(52) U.S. Cl.
  CPC ............... *B25H 1/10* (2013.01); *G02B 21/34* (2013.01); *H01J 37/20* (2013.01); *H01J 2237/20207* (2013.01)

(58) Field of Classification Search
  CPC . G02B 21/34; B25H 1/10; H01J 2237/20207; H01J 37/20; B25B 11/00; B25B 11/02; B25B 1/00; B25B 1/02; B25B 1/04
  USPC ............................ 269/43, 903, 246, 156, 309
  See application file for complete search history.

(56) References Cited

U.S. PATENT DOCUMENTS

| | | | |
|---|---|---|---|
| 5,225,683 A | | 7/1993 | Suzuki et al. |
| 5,906,539 A | * | 5/1999 | Tabei ...................... B24B 41/06 269/291 |
| 6,190,113 B1 | * | 2/2001 | Bui ................... H01L 21/68742 414/217 |
| 6,319,470 B1 | | 11/2001 | Lefevre et al. |
| 6,495,838 B1 | * | 12/2002 | Yaguchi .................. H01J 37/20 250/443.1 |
| 7,306,509 B2 | * | 12/2007 | Hoshino ............... B24B 37/042 451/28 |

(Continued)

FOREIGN PATENT DOCUMENTS

| | | |
|---|---|---|
| DE | 45620 | 3/1887 |
| EP | 2883813 A1 | 6/2015 |

(Continued)

OTHER PUBLICATIONS

Office Action issued in JP2019-178460 dated Jun. 29, 2021.
Extended European Search Report issued in EP20196485.5 dated Feb. 23, 2021.

*Primary Examiner* — Lee D Wilson
*Assistant Examiner* — Sidney D Hohl
(74) *Attorney, Agent, or Firm* — The Webb Law Firm

(57) ABSTRACT

A retainer is placed on a retainer holding portion formed on a sample chip worktable. With an operation of a button, a take-out support mechanism operates. That is, an upthrust pin moves upward. With this process, an orientation of a sample chip stored in the retainer is changed from a horizontal orientation to an inclined orientation. A plurality of openings through which the upthrust pin passes are formed in the retainer.

9 Claims, 13 Drawing Sheets

(56) References Cited

U.S. PATENT DOCUMENTS

| | | | |
|---|---|---|---|
| 11,251,014 B2* | 2/2022 | van den Boogaard | H01J 37/20 |
| 2013/0008266 A1 | 1/2013 | Houjou | |
| 2015/0205089 A1* | 7/2015 | Machida | G02B 21/34 |
| | | | 359/391 |
| 2018/0348497 A1 | 12/2018 | Sakamoto et al. | |

FOREIGN PATENT DOCUMENTS

| | | | |
|---|---|---|---|
| JP | 4324240 A | 11/1992 |
| JP | 721960 A | 1/1995 |
| JP | 200074803 A | 3/2000 |
| JP | 2002148216 A | 5/2002 |
| JP | 2011197040 A | 10/2011 |
| JP | 201441711 A | 3/2014 |
| JP | 201877950 A | 5/2018 |
| JP | 201877966 A | 5/2018 |
| WO | 2017099107 A2 | 6/2017 |

* cited by examiner

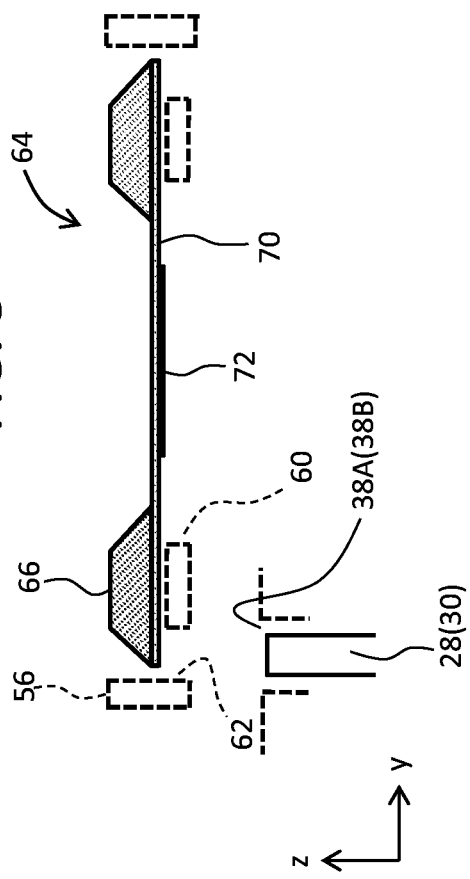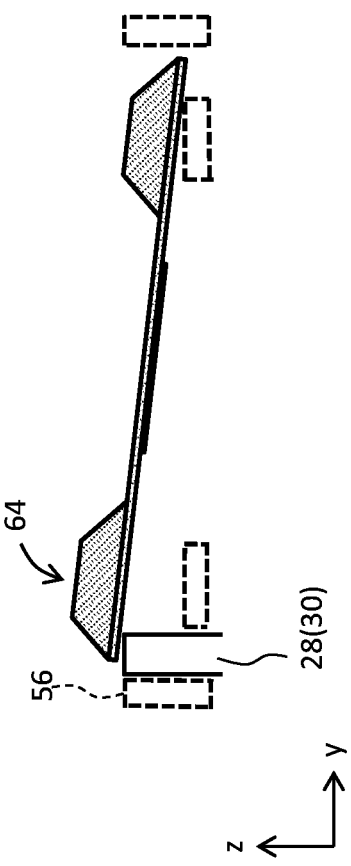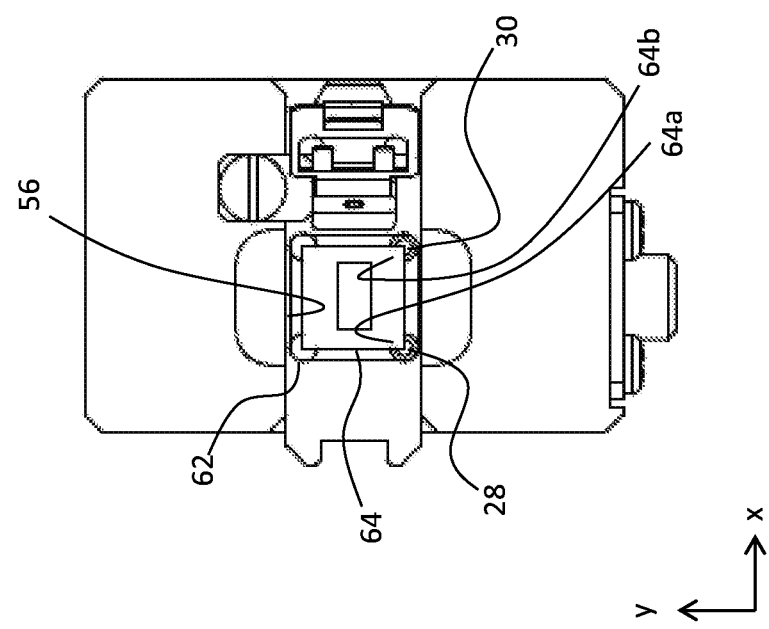

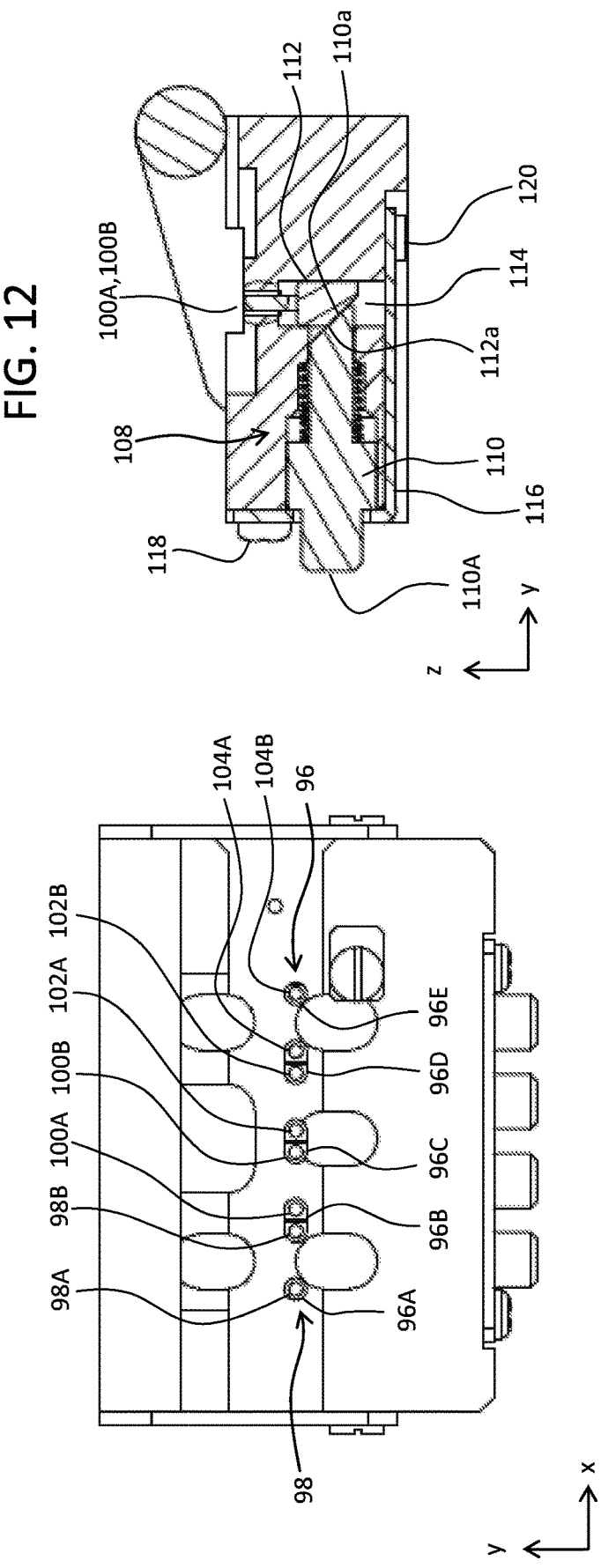

SAMPLE CHIP WORKTABLE AND RETAINER

CROSS REFERENCE TO RELATED APPLICATION

This application claims priority to Japanese Patent Application No. 2019-178460 filed Sep. 30, 2019, the disclosure of which is hereby incorporated by reference in its entirety.

BACKGROUND OF THE INVENTION

Field of the Invention

The present disclosure relates to a sample chip worktable and a retainer, and in particular to a technique for supporting taking-out of a sample chip from a retainer.

Description of Related Art

When a sample is observed using an electron microscope or an optical microscope, a sample chip is used as necessary. The sample chip is formed from, for example, a membrane supporting the sample, and a substrate surrounding the membrane. Typically, the sample chip is placed on a retainer, which is a retention device, and the retainer is placed in a sample chamber of the electron microscope or on a sample stage of the optical microscope. Normally, a chip storage portion is formed as a recess or a quadrangular groove on the retainer, and the sample chip is placed in the chip storage portion. In this placement, a tool such as forceps is used as necessary.

JP 2014-41711 A discloses a tool for supporting a grid exchanging task. A grid is a member which supports the sample. When the grid is taken out from a sample holder, which corresponds to the retainer, an entirety of the grid is pressed upward from below, by a protrusion provided at a tip of the tool. With this configuration, a state is formed in which the grid is raised from the sample holder while maintaining a horizontal orientation. The tool does not mount or retain the sample holder. That is, the tool is not a worktable for supporting a task of taking out the sample from the sample holder.

In a situation in which the sample chip is stored in the chip storage portion of the retainer, the sample chip cannot be easily gripped with a tool such as a forceps. When the gripping of the sample chip with the tool is incomplete, there is a possibility that the sample chip may fall off from the tool. The falling of the sample chip may cause damages to or contamination of the sample. When a gripping position of the sample chip by the tool is inappropriate, there is a possibility of damages of the sample chip or damages of the sample itself. Even when these problems are not caused, there is desire to facilitate the task for taking out the sample chip from the retainer.

SUMMARY OF THE INVENTION

An advantage of the present disclosure lies in supporting taking-out of the sample chip from the retainer. Alternatively, an advantage of the present disclosure lies in provision of a worktable which can support the taking-out of the sample chip, and a retainer compatible with the worktable.

According to one aspect of the present disclosure, there is provided a sample chip worktable comprising: a mounting surface on which a retainer is mounted, the retainer having a chip storage portion which stores a sample chip for observation under a microscope; and a take-out support mechanism that changes an orientation of the sample chip when the sample chip is taken out from the chip storage portion.

According to the structure described above, the orientation of the sample chip may be changed by operating the take-out support mechanism provided on the chip worktable, and then, the sample chip can be taken out. With this configuration, the taking-out task can be facilitated.

The sample chip includes the sample to be observed by the electron microscope, the optical microscope, or the like. The retainer is a tool which retains the sample chip. The chip storage portion of the retainer is normally formed as a recess or a quadrangular groove, and retains the sample chip in a horizontal orientation. For example, the retainer itself is placed in the sample chamber of a transmission electron microscope, or the retainer itself is placed on the sample stage of the optical microscope. The take-out support mechanism is operated by an operation force caused by a user or an operation force generated by an actuator or the like, and changes the orientation of the sample chip to facilitate taking-out of the sample chip.

In an exemplary configuration, with a change of the orientation of the sample chip, a gap is created at a lower side of the sample chip. In this case, the tool such as the forceps can be inserted into the gap. After the orientation change, at least a part of the sample chip continues to be stored in the chip storage portion. With this configuration, a state is maintained in which the sample chip cannot freely move in the horizontal direction. As a result, unprepared falling of the sample chip from the retainer or the like can be prevented.

According to another aspect of the present disclosure, in the sample chip worktable, the take-out support mechanism changes the orientation of the sample chip from a horizontal orientation to an inclined orientation. In the inclined orientation of the sample chip, a wedge-shape gap is created at the lower side of the sample chip. A tool can be inserted into the gap. For example, the sample chip in the inclined orientation is caught by the forceps inserted from a slanted direction.

According to another aspect of the present disclosure, in the sample chip worktable, the sample chip includes a portion which holds the sample, and a frame provided at a periphery of the portion, and the take-out support mechanism causes the inclined orientation by pressing the frame upward. This structure is intended to protect the sample and a portion retaining the sample (for example, a membrane) by applying a dynamical action on a hard frame. The frame may be pressed upward by a member which protrudes and moves at a location immediately below the frame (for example, a pin), or the frame may be pressed upward by moving a member inserted to the lower side of the frame from the horizontal direction (for example, a hook member) upward.

According to another aspect of the present disclosure, in the sample chip worktable, the take-out support mechanism includes a pair of upthrust pins which protrude from a bottom surface of the chip storage portion and which thrust two corner portions of the frame upward. The two corner portions of the frame are normally structurally strong portions, and the upthrust force is applied to such portions. In this case, the pair of upthrust pins are moved upward in a cooperative manner. Alternative configurations may be considered in which a center part of a certain edge portion of the frame is pressed upward by a single pin, or in which a certain edge portion of the frame is pressed upward by a plate-shaped member.

According to another aspect of the present disclosure, in the sample chip worktable, the take-out support mechanism includes: an operation member which is operated by a user; and a pressing-up member which is moved upward by an operation force applied by the operation member, to thereby press the sample chip upward and cause the inclined orientation. According to this configuration, because components such as an actuator do not need to be provided on the sample chip worktable, the structure of the sample chip worktable can be simplified. In addition, an operation to change the orientation of the sample chip can be executed while checking the change of the orientation of the sample chip.

According to another aspect of the present disclosure, in the sample chip worktable, the retainer includes a plurality of chip storage portions which store a plurality of sample chips, the take-out support mechanism includes a plurality of pressing-up members provided in the plurality of chip storage portions, the orientations of the plurality of sample chips are changed from the horizontal orientation to the inclined orientation by the plurality of pressing-up members, and the plurality of pressing-up members operate independently from each other. According to this configuration, a plurality of sample chips may be simultaneously placed in the sample chamber of the electron microscope, or the plurality of sample chips may be simultaneously placed on the sample stage of the optical microscope. According to the above-described configuration, for example, the plurality of pressing-up members may be operated sequentially, to exchange the plurality of the sample chips in sequence.

According to another aspect of the present disclosure, the sample chip worktable further comprises a member which enables a cooperative movement of the plurality of pressing-up members. According to this configuration, orientations of the plurality of sample chips can be changed simultaneously. According to another aspect of the present disclosure, the sample chip worktable further comprises a member that restricts a rising movement of the retainer mounted on the mounting surface. According to this configuration, even if the upthrust force is applied on the retainer, the rise of the retainer can be prevented.

According to another aspect of the present disclosure, in the sample chip worktable, the retainer comprises a retainer body and a cover; after the sample chip is equipped on the retainer body mounted on the mounting surface, the retainer body is covered by the cover, so that the sample chip is sandwiched between the retainer body and the cover, and the take-out support mechanism changes the orientation of the sample chip in a state in which the retainer body is not covered by the cover.

According to another aspect of the present disclosure, in the sample chip worktable, a cover mounting surface is provided adjacent to the mounting surface, and the sandwiched state of the sample chip is formed by the cover being slid from a position above the cover mounting surface to a position above the retainer body. As a scheme for opening and closing the cover, an axial rotation scheme and a slide scheme may be considered, and the above-described configuration employs the latter scheme. Alternatively, the rotation scheme and the slide scheme may be combined. Alternatively, the slide scheme may be employed separately from the take-out support mechanism. The slide scheme may be considered as a structural characteristic of the retainer itself.

According to another aspect of the present disclosure, there is provided a retainer which can be mounted on a sample chip worktable, the retainer comprising: a chip storage portion that stores a sample chip; and an opening that is formed in the chip storage portion and through which a pressing-up member, which presses the sample chip upward to change an orientation of the sample chip, passes. According to this configuration, a retainer can be provided which allows a movement of the pressing-up member.

According to another aspect of the present disclosure, in the retainer, the sample chip includes a portion which holds a sample, and a frame provided at a periphery of the portion; the pressing-up member has two upthrust pins which thrust two corner portions of the frame upward, the opening includes two openings corresponding to the two corner portions, and the two upthrust pins move upward through the two openings. Normally, corner portions in the frame are, in general, structurally strong portions. By applying the upthrust force to two corner portions, it is possible to protect the sample and the portion supporting the sample.

According to another aspect of the present disclosure, there is provided a method of taking out a new sample chip using a sample chip worktable. The method includes placing on the sample chip worktable a retainer having a sample chip after observation under a microscope, operating a take-out support mechanism of the sample chip worktable to cause an inclined orientation of the sample chip, and detaching the sample chip in the inclined state.

BRIEF DESCRIPTION OF THE DRAWINGS

Embodiment(s) of the present disclosure will be described based on the following figures, wherein:

FIG. 7 is a diagram showing an upper surface in a state after the storage of the sample chip in the first embodiment of the present disclosure;

FIG. 8 is a schematic diagram showing a horizontal orientation;

FIG. 9 is a schematic diagram showing an inclined orientation;

FIG. 11 is a diagram showing an upper surface of the sample chip worktable according to the second embodiment of the present disclosure;

FIG. 12 is a diagram showing a cross section of the sample chip worktable according to the second embodiment of the present disclosure;

DESCRIPTION OF THE INVENTION

Embodiments of the present disclosure will now be described with reference to the drawings.

FIGS. 1 to 9 show a sample chip worktable according to a first embodiment of the present disclosure. The sample chip worktable is a base mount which is used when a sample chip is equipped on a retainer or when the sample chip is detached from the retainer. The sample chip worktable may alternatively be called a sample chip exchange mount. The retainer and the sample chip will be described later in detail.

Figure 1:
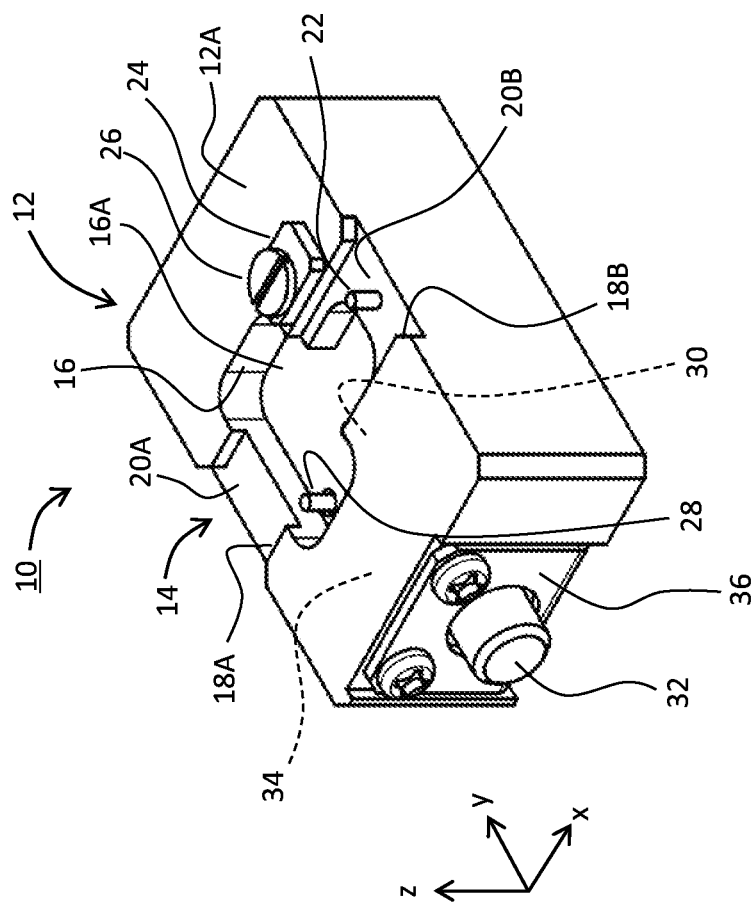
FIG. 1 is a perspective diagram of a sample chip worktable according to a first embodiment of the present disclosure.

In FIG. 1, a sample chip worktable 10 has a block-shape body 12. The body 12 is formed from a metal such as aluminum. Alternatively, the body 12 may be formed from a resin. A retainer holding portion 14 having an indented shape is formed at an upper part of the body 12. The retainer holding portion 14 has two grooves 18A and 18B distanced from each other in an x direction, and a recess 16 formed between the grooves 18A and 18B. Bottom surfaces of the two grooves 18A and 18B are mounting surfaces 20A and 20B. The retainer (not shown) is mounted on the mounting surfaces 20A and 20B. With this configuration, a state is formed in which the retainer holding portion 14 holds the retainer. On the mounting surface 20B, a positioning pin 22 is provided. The positioning pin 22 is inserted into a positioning hole formed on the retainer body when the retainer is held.

An upper surface 12A of the body 12 is a flat surface, and a lock plate 24 is provided thereon. More specifically, the lock plate 24 is turnably held by a screw 26. When the lock plate 26 turns, a portion thereof moves to a position above the groove 18B. When a long-length direction of the lock plate 24 becomes parallel to a y direction when viewed from above, an upper surface of the retainer held on the retainer holding portion 14 contacts a lower surface of the lock plate 24, and a rising movement of the retainer is restricted. That is, a locked state is formed in which the retainer is completely restrained, and the retainer is fixed on the sample chip worktable 10.

The retainer holding portion 14 restricts a horizontal movement of the retainer, with the positioning pin 22 and the lock plate 24. With these elements, the retainer is practically integrated with the sample chip worktable 10. In this state, the sample chip is exchanged.

The recess 16 extends wider in a z direction and in the y direction than do the two grooves 18A and 18B. In the retainer held state, a gap is created between a back surface of the retainer and a bottom surface 16A of the recess 16, and gaps are created between two long-length-side sides of the retainer and two side walls (two side walls orthogonal to the y direction) of the recess 16. The former gap (gap at the lower side of the retainer) prevents contact of the sample chip with the bottom surface 16A of the recess 16. The latter gaps (gaps on both sides of the retainer) function as spaces into which a fingertip, a tool, or the like is inserted.

Two openings are formed in the bottom surface 16A, and two upthrust pins 28 and 30 rise through these openings. The two upthrust pins 28 and 30 function as pressing-up members, and form a relevant part of a take-out support mechanism 34. The two upthrust pins 28 and 30 achieve a pressing-up action or an upthrust action to change the orientation of the sample chip from a horizontal orientation to an inclined orientation during the taking-out of the sample chip.

The take-out support mechanism 34 has a button 32 which is pressed and operated by a user. A cavity is formed inside the body 12, and the take-out support mechanism 34 is placed within the cavity. The cavity is covered by a cover 36. When the button 32 is operated, as will be described later in detail, the two upthrust pins 28 and 30 cooperate and move upward, and thrust two corner portions of the sample chip upward. With this process, the inclined orientation of the sample chip is formed.

The x direction is a first horizontal direction, the y direction is a second horizontal direction, and the z direction is a vertical direction. These three directions are orthogonal to each other.

Figure 2:
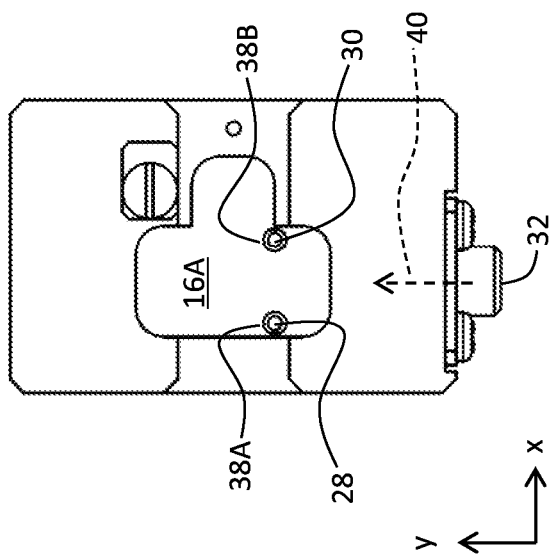
FIG. 2 is a diagram showing an upper surface of the sample chip worktable according to the first embodiment of the present disclosure.

FIG. 2 shows an upper surface of the sample chip worktable. As already described, two openings 38A and 38B are formed in the bottom surface 16A of the recess, and the two upthrust pins 28 and 30 move upward through these openings. These movements are caused by a pressing operation 40 of the button 32. In a natural state in which the button 32 is not operated, the two upthrust pins 28 and 30 are positioned below the two openings 38A and 38B, and thus are in a withdrawn state.

Figure 3:
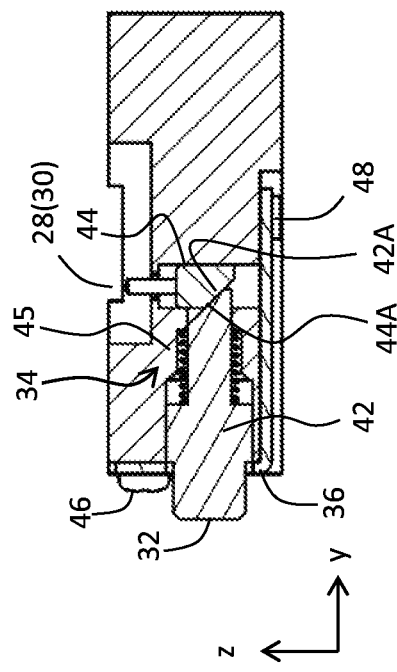
FIG. 3 is a diagram showing a cross section of the sample chip worktable according to the first embodiment of the present disclosure.

FIG. 3 shows a cross section of the sample chip worktable. The take-out support mechanism 34 is formed form an operation member 42 which moves in the y direction, a block 44 which moves in the z direction, and the two upthrust pins 28 and 30 provided on the block 44. One end of the operation member 42 functions as the button 32. On the other end of the operation member 42, a slanted surface 42A is formed. A slanted surface 44A is also formed on the block 44. The slanted surface 42A and the slanted surface 44A contact each other, and, when the operation member 42 moves forward in the y direction in FIG. 3, an upward movement force with respect to the block 44 is created. In other words, with the contact relationship between the two slanted surfaces 42A and 44A, a horizontal movement force is converted into a vertical movement force. Alternatively, the movement direction may be converted using a link, a cam, or the like, A backward movement force is applied from a spring 45 on the operation member 42. In the natural state, the operation member 42 is at a backward-moved end, and, in this state, the two upthrust pins 28 and 30 are positioned at the lowermost level. When the operation member 42 moves forward, the two upthrust pins 28 and 30 move upward. For example, amounts of stroke of the two upthrust pins 28 and 30 are set such that a part of the sample chip (an upper side portion in the inclined orientation) is aligned with or at a higher position than an upper surface opening level of the recess. The cover 36 has an L shape, with one end fixed by a screw 46 with respect to the body, and the other end fixed by a screw 48 with respect to the body.

Figure 4:
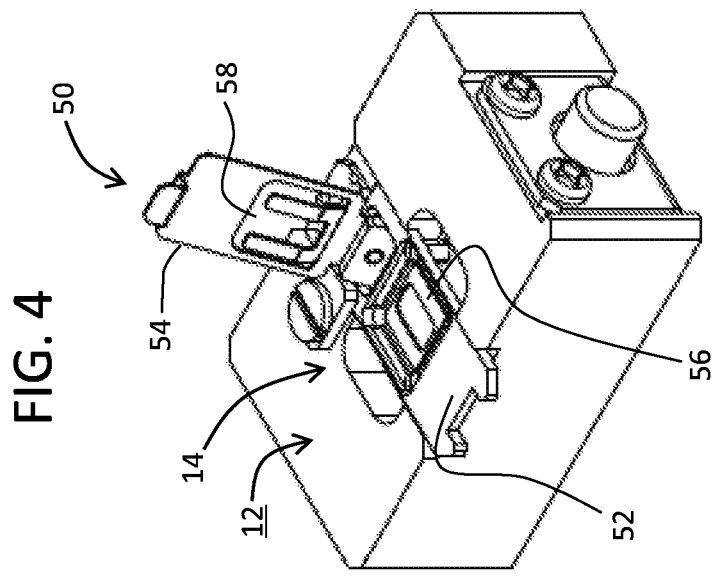
FIG. 4 is a perspective diagram of the sample chip worktable and a retainer according to the first embodiment of the present disclosure.

FIG. 4 shows the sample chip worktable holding a retainer. A retainer 50 is placed in the retainer holding portion 14, and is held by the retainer holding portion 14. The retainer 50 is formed from a retainer body 52 and a cover 54. The cover 54 rotationally moves around a rotation axis provided on the retainer body 52.

Each of the retainer body 50 and the cover 54 is formed from a metal such as copper, phosphor bronze, beryllium copper, or the like. From the viewpoint of placement in an electron microscope, the retainer 50 is formed from a material which does not affect electron beams. The retainer body 52 has a chip storage portion 56 which stores the sample chip. The chip storage portion 56 is a recess or a quadrangular groove. At a bottom of the chip storage portion 56, an opening for observation is formed. The cover 54 is a leaf spring-shape member as a whole, and has a chip press 58. The chip press 58 includes two pressing pieces for pressing the frame of the sample chip down.

Figure 5:
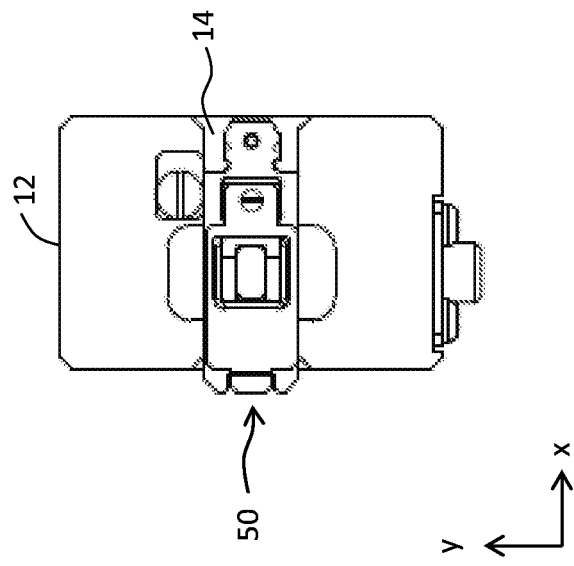
FIG. 5 is a diagram showing upper surfaces of the sample chip worktable and the retainer according to the first embodiment of the present disclosure.

FIG. 5 shows upper surfaces of the retainer and the chip worktable. In the retainer 50, the cover is in a closed state. As described above, the retainer holding portion 14 is formed in the body 12, and the retainer 50 is held by the retainer holding portion 14.

Figure 6:
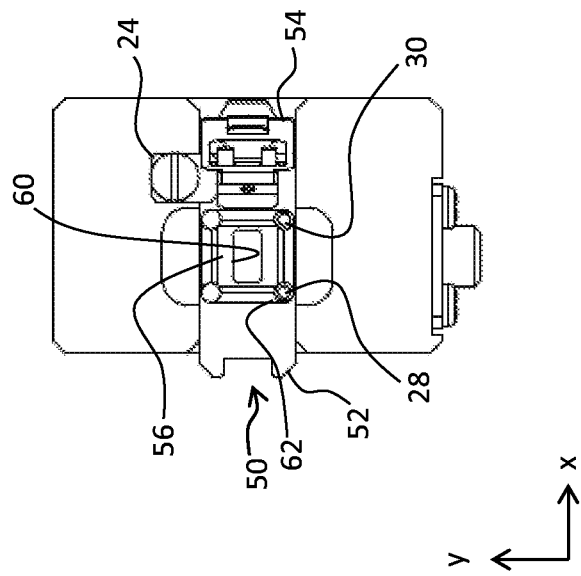
FIG. 6 is a diagram showing an upper surface in a state before storage of a sample chip in the first embodiment of the present disclosure.

FIG. 6 shows a state in which the cover 54 of the retainer 50 is opened. A rising movement of the retainer body 52 is restricted by the lock plate 24. The chip storage portion 56 is formed in the retainer body 52, and four openings 62 are formed at four corner portions on the bottom surface of the chip storage portion 56. At a center part of the bottom surface, an opening 60 for observation is formed. The two upthrust pins 28 and 30 move upward and downward through two openings 62, among the four opening 62, shown at a lower side of FIG. 6.

FIG. 7 shows a placement state of a sample chip. A sample chip 64 is placed in the chip storage portion 56, and has the horizontal orientation. As will be described below, the sample chip 64 is formed from a membrane which is a sample supporting film, and a frame which is a substrate surrounding the membrane. Two particular corner portions 64a and 64b (two corner portions at the lower side in FIG. 7) in the frame are thrusted upward from below, by the two upthrust pins 28 and 30. With this process, the orientation of the sample chip 64 changes from the horizontal orientation to the inclined orientation.

Two openings 62 are formed on the bottom surface of the chip storage portion 56 corresponding to the two particular corner portions 64a and 64b of the sample chip 64. In addition to these openings, two openings 62 are formed corresponding to the other two corner portions (two corner portions at the upper side in FIG. 7) of the sample chip 64. Alternatively, these openings may be omitted.

FIG. 8 shows the horizontal orientation of the sample chip 64 stored in the chip storage portion 56. FIG. 9 shows the inclined orientation of the sample chip 64. In FIGS. 8 and 9, the form of the sample chip 64, in particular, the thickness, is represented in an exaggerated manner.

In FIG. 8, the sample chip 64 is formed from a membrane 70 and a frame 66. The membrane 70 is a thin film which supports a sample 72 which is an observation target, and is, for example, an SiN membrane. A thin sample 72 is adhered on a back surface of the membrane 70. In order to electrically or optically observe the sample 72, the opening 60 for exposing the membrane 70 (and the sample 72) at the lower side is formed on the bottom surface of the chip storage portion 56. The membrane 70 is formed from a material and in a thickness to allow transmission of electron beams or the like.

For example, a length of one side of the sample chip 64 is in a range of 5 mm to 10 mm. When a size of the membrane 70 is defined as A mm×B mm, A is within a range of 0.5 mm to 3 mm, and B is within a range of 0.5 mm to 7 mm. The thickness of the membrane 70 is within a range of 20 nm to 120 nm. The numerical values described herein are merely exemplary, and may change according to various circumstances.

The frame 66 is, for example, an Si substrate. The membrane 70 is provided in an opening of the frame 66. The opening allows passage of the electron beam. Alternatively, as the material of the frame 66 and the material of the membrane 70, materials other than those exemplified above may be used.

As described above, four openings 62 are formed on the bottom surface of the chip storage portion, and, of these, two particular openings 62 function as openings through which the upthrust pins 28 and 30 pass. The two openings 38A and 38B are formed on the bottom surface of the recess of the sample chip worktable. Through these openings, the two upthrust pins 28 and 30 move upward. The two upthrust pins 28 and 30 reach the frame 66 of the sample chip 64 through the two openings 38A and 38B formed in the retainer body, and cause the orientation of the sample chip 64 to change from the horizontal orientation to the inclined orientation.

FIG. 9 shows the inclined orientation of the sample chip. A large part (in particular, the lower part) of the sample chip 64 continues to be stored in the chip storage portion 56. This configuration prevents falling off of the sample chip 64 from the chip storage portion 56. On the other hand, the upper side portion (specifically, an end on a lower surface of the frame) of the sample chip 64 reaches an upper surface opening level of the chip storage portion or a higher position, and a wedge-shape gap is created on the lower side of the sample chip 64. A tool or the like can be inserted into this gap. For example, the upper side portion of the sample chip 64 may be pulled upward beyond the upper surface opening level of the chip storage portion 56. In this case, a gap is created between the upper side portion and the upper surface of the retainer body. Thus, the taking-out of the sample chip 64 can be further facilitated.

In the inclined orientation also, the movement of the sample chip 64 in the horizontal direction is restricted by the chip storage portion 56, completely or to a certain degree. Thus, the sample chip 64 does not unpreparedly fall off from the retainer. When the sample chip 64 is taken out and a new sample chip is placed in the chip storage portion, the two upthrust pins may be caused to function or not to function.

Alternatively, as a member for the upward thrust, a single upthrust pin may be used. Alternatively, a particular side edge portion of the sample chip may be pressed upward by a plate-shape member. Alternatively, the inclined orientation of the sample chip may be formed by inserting a lever at a lower side of the sample chip from the horizontal direction, and moving the lever upward. Alternatively, an actuator may be provided on the sample chip worktable, and the pressing-up member may be moved upward by a drive force generated therefrom. In the present embodiment, because the front side of the sample chip is pressed upward, an advantage can be obtained in that the tool can be easily inserted from a front side of the sample chip.

Figure 10:
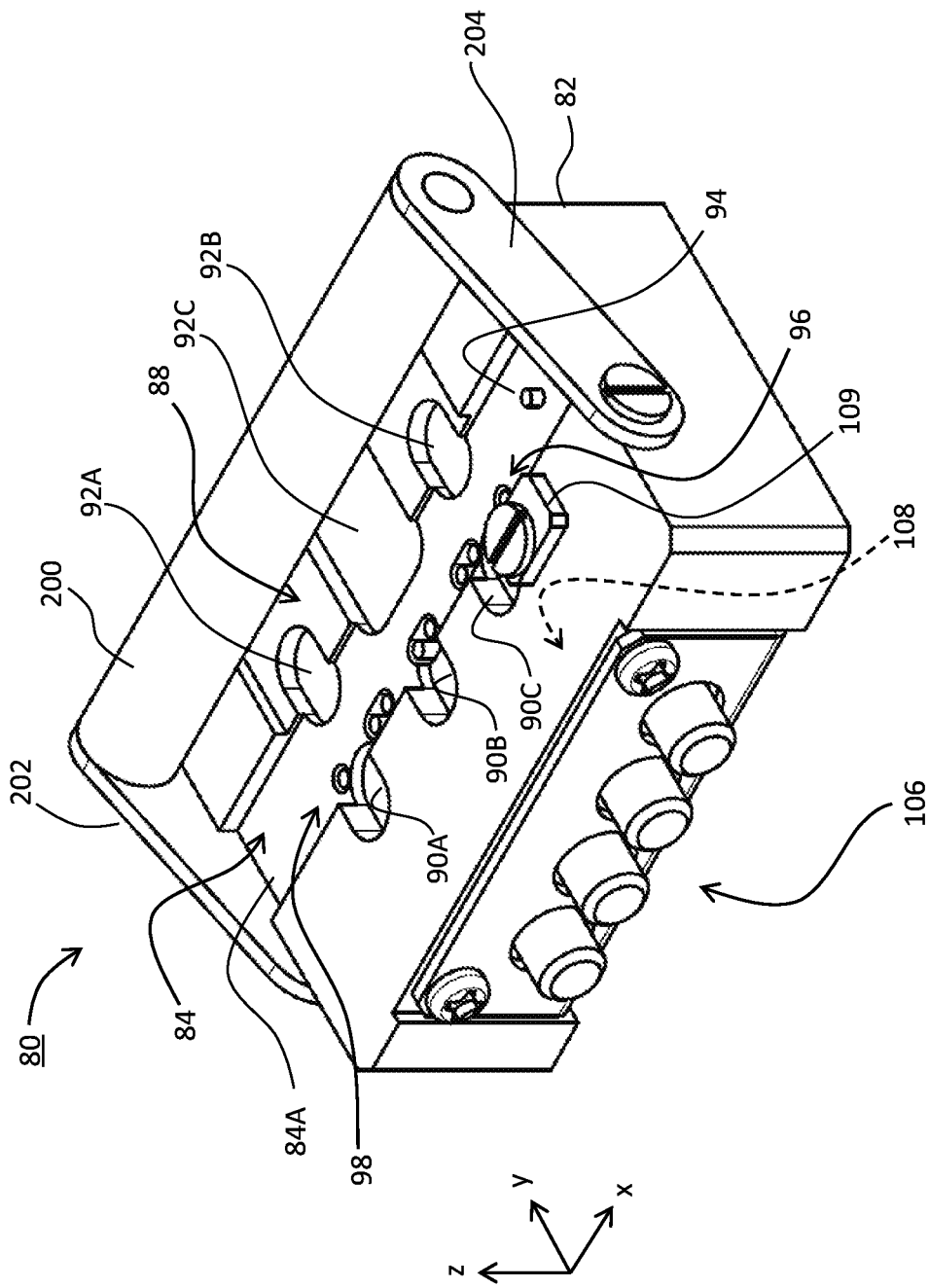
FIG. 10 is a perspective diagram of a sample chip worktable according to a second embodiment of the present disclosure.

FIGS. 10 to 24 show a sample chip worktable according to a second embodiment of the present disclosure. In FIG. 10, a sample chip worktable 80 has a block-shape body 82. The body 82 is formed from a metal such as aluminum. Alternatively, the body 82 may be formed from a resin. A retainer holding portion 84 is formed at an upper part of the body 82. The retainer holding portion 84 has a groove-shape form, and a bottom surface thereof is a retainer body mounting surface 84A. A cover mounting surface 88 is formed adjacent to and in parallel to the retainer body mounting surface 84A. The cover mounting surface 88 also has a groove-shape form. A positioning pin 94 is provided on the retainer body mounting surface 84A. When the retainer body is mounted on the retainer body mounting surface 84A, the positioning pin 94 is inserted into a positioning hole formed on the retainer body.

A plurality of recesses 90A, 90B, and 90C in communication with the retainer holding portion 84 are formed on the body 82. In addition, a plurality of recesses 92A, 92B, and 92C in communication with the retainer holding portion 84 are formed on the body 82.

A height relationship will now be described. The cover mounting surface 88 is formed at a level which is one step lower from an upper surface of the body 82, and the retainer body mounting surface 84A is formed at a level which is one step further lower from the cover mounting surface 88. Bottom surface levels of the recesses 90A, 90B, 90C, 92A, 92B, and 92C are lower than the retainer body mounting surface 84A. A width of the body 82 in the x direction is, for example, within a range of 5 cm to 6 cm, and a width of the body 82 in the y direction is, for example, within a range of 3 cm to 4 cm.

An opening array 96 is formed on the retainer body mounting surface 84A. In the opening array 96, an upthrust pin array 98 is provided in a manner to allow upward and downward movements. In the illustrated exemplary configuration, the opening array 96 is formed from five openings arranged in the x direction. In the illustrated exemplary configuration, the upthrust pin array 98 is formed from eight upthrust pins (four upthrust pin pairs when considered in operation units) arranged in the x direction.

A lock plate 109 is provided in a turnable manner on an upper surface of the body 82. A take-out support mechanism 108 which individually operates the four upthrust pin pairs is provided in the body 82. The take-out support mechanism 108 will be described later in detail. In addition, a handle 200 is attached to the body 82 via two arms 202 and 204. The handle 200 rotationally moves. Each of the handle 200 and the arms 202 and 204 is formed from, for example, stainless steel. A button array 106 is provided on a front surface of the body 82. The button array 106 is formed from four buttons arranged in the x direction.

FIG. 11 shows an upper surface of the sample chip worktable. As described above, an opening array 96 is formed from five openings 96A, 96B, 96C, 96D, and 96E. Of these, the openings 96B, 96C, and 96D are long holes extending in the x direction, and respectively function as passages for passing two of the upthrust pins through. The two openings 96A and 96E at the ends are circular holes for passing one upthrust pin therethrough.

As described above, the upthrust pin array 98 is formed from four upthrust pin pairs. Specifically, upthrust pins 98A and 98B form a first upthrust pin pair, upthrust pins 100A and 100B form a second upthrust pin pair, upthrust pins 102A and 102B form a third upthrust pin pair, and upthrust pins 104A and 104B form a fourth upthrust pin pair. In this manner, four upthrust pin pairs are provided corresponding to four sample chips. The four upthrust pin pairs operate individually. Alternatively, as will be described later, a handle may be used to collectively operate the four upthrust pin pairs.

FIG. 12 shows a cross section of the sample chip worktable. The take-out support mechanism 108 is formed from four units of identical structure. Each unit is formed from an operation member, a block, and the thrust pin pair. In FIG. 12, an operation member 110, a block 112, and the thrust pin pair including pins 100A and 100B, of a certain unit, are shown.

One end of the operation member 110 functions as a button 110A. On the other end, a slanted surface 110a is formed. The block 112 moves upward and downward in a cavity 114 formed in the body. A slanted surface 112a is formed at a lower end of the block 112. The slanted surface 110a and the slanted surface 112a contact each other. The pair of upthrust pins 100A and 100B are fixed on the block 112.

A force in a backward movement direction is applied by a spring on the operation member 110. One end of a cover 116 is fixed by a screw 118 on the body, and the other end of the cover 116 is fixed by a spring 120 on the body.

When the button 110A is operated and is pressed toward a deeper depth side in the y direction, the operation member 110 moves forward, and the forward movement force is converted into a force for moving the block 112 upward by a contact relationship of the two slanted surfaces 110a and 112a. With an upward movement of the block 112, the pair of upthrust pins 100A and 100B fixed thereon move upward, and thrust the frame of the sample chip stored in the chip storage portion upward from below. With this process, the orientation of the sample chip is changed from the horizontal orientation to the inclined orientation.

As described above, in the sample chip worktable according to the second embodiment, the take-out support mechanism is formed from four units. The four units have four buttons, and a particular button corresponding to the sample chip which is a work target is selected, and is operated. With this process, a particular unit having the particular button is operated. In the second embodiment, the four units are arranged in a direction of arrangement of the four chip storage portions, and the four buttons are also arranged in this direction. According to this configuration, the button to be operated can be selected without an error. Alternatively, the four buttons can be collectively pressed by a rotation of the handle described above, in which case, all of the four units are operated simultaneously.

Figure 13:
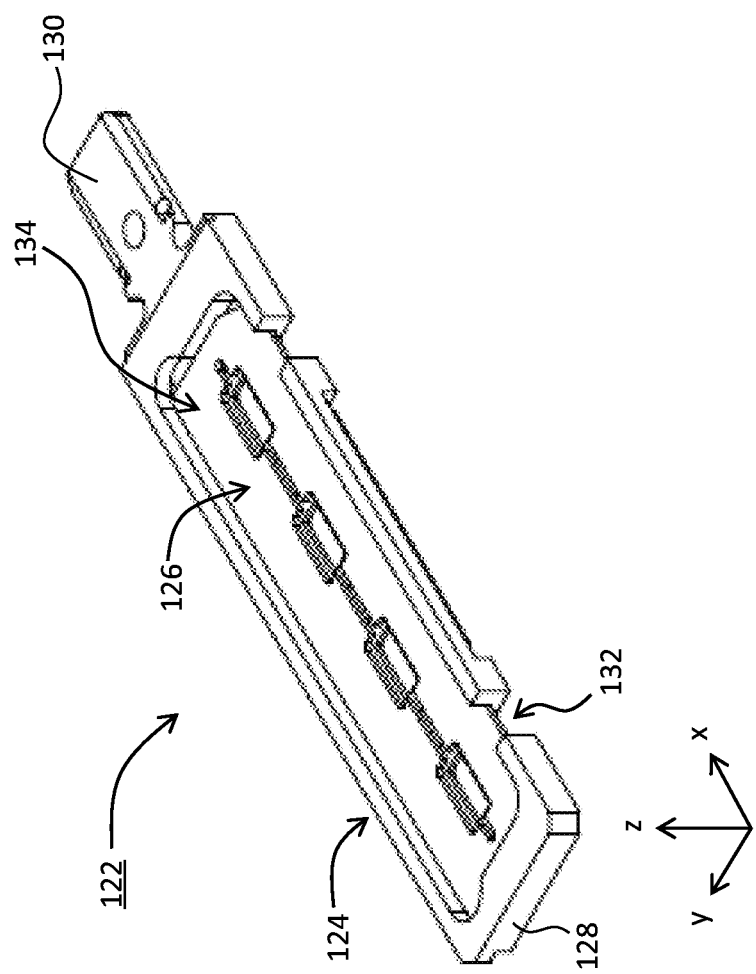
FIG. 13 is a perspective diagram of a retainer according to the second embodiment of the present disclosure.

FIG. 13 shows an example structure of a retainer placed on the sample chip worktable. A retainer 122 which is illustrated is formed from a retainer body 124 and a cover 126. The retainer body 122 has an outer frame 128. An inside of the retainer body 122 is a space 132 which stores the four sample chips and which accepts the cover 126. The retainer body 122 has a protruding piece 130. The protruding piece 130 is a portion which is held by a retainer holding device (not shown). An opening 134 is formed on the cover 126. The opening 134 includes a plurality of openings and a plurality of slits consecutively provided in the x direction.

Figure 14:
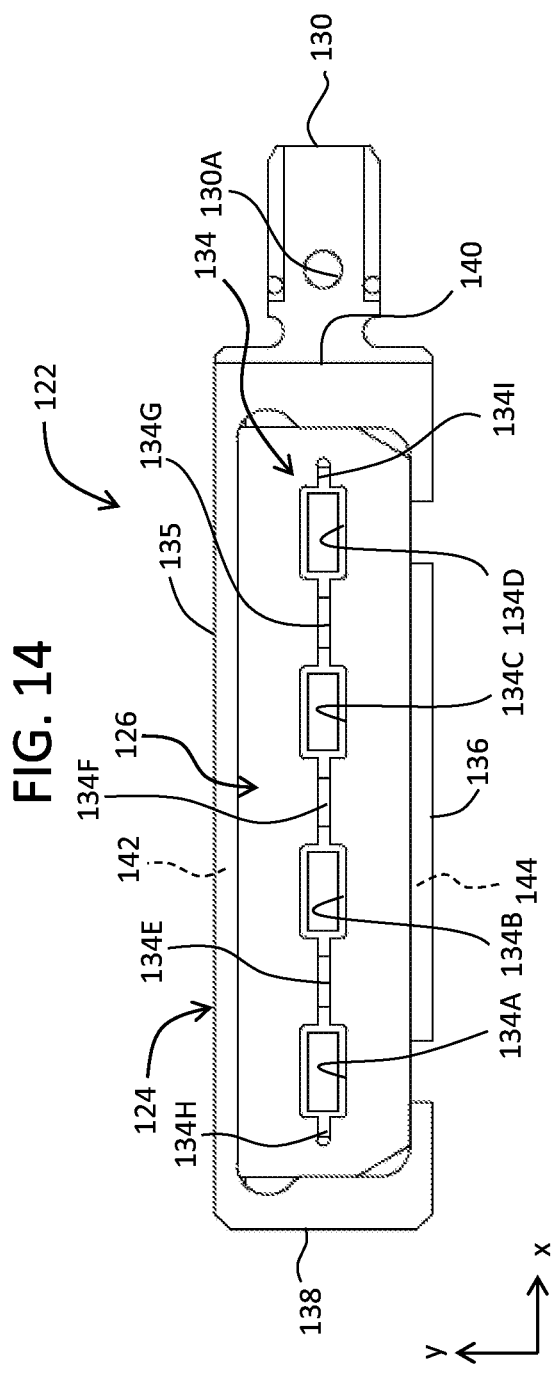
FIG. 14 is a diagram showing an upper surface of the retainer according to the second embodiment of the present disclosure.
Figure 15:
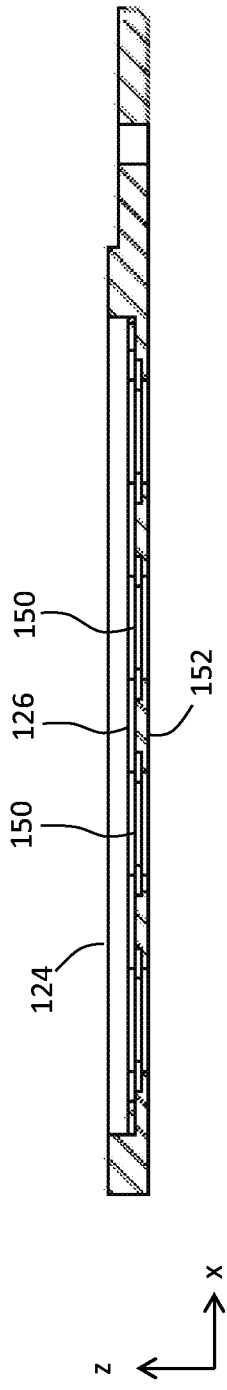
FIG. 15 is a diagram showing a cross section of the retainer according to the second embodiment of the present disclosure.
Figure 16:
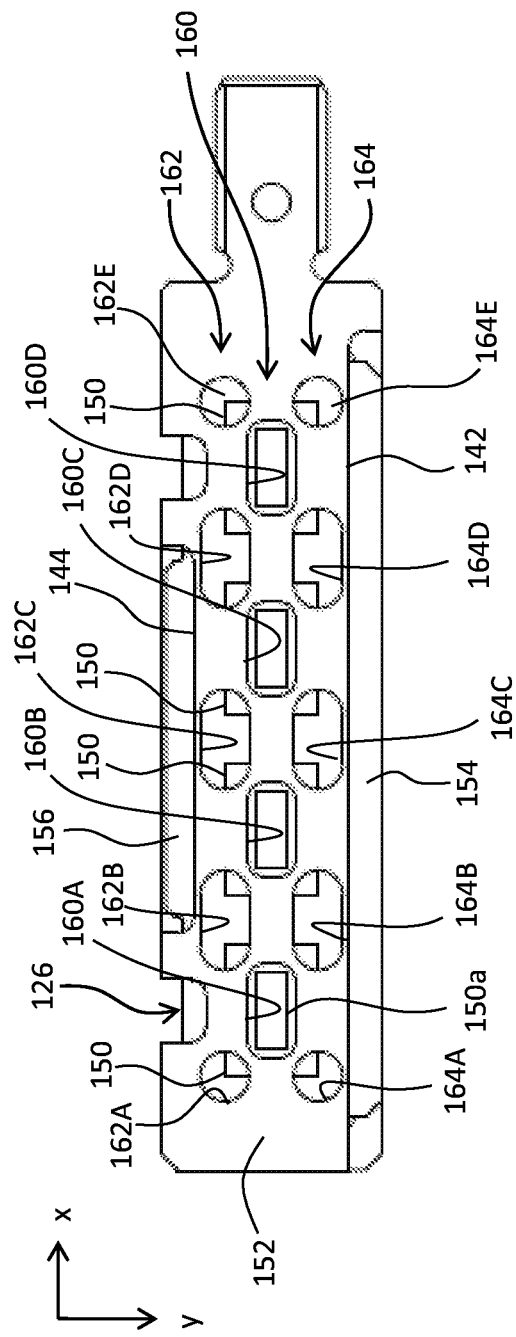
FIG. 16 is a diagram showing a bottom surface of the retainer according to the second embodiment of the present disclosure.

FIG. 14 shows an upper surface of the retainer 122. FIG. 15 shows a cross section of the retainer. FIG. 16 shows a lower surface of the retainer.

In FIG. 14, the retainer body 124 has four chip storage portions arranged in the x direction. Each chip storage portion is a recess or a quadrangular groove, and the sample chip is placed therein. For example, in a state in which four chips are stored in the four chip storage portions, the retainer body 124 is covered by the cover 126. With this configuration, the four sample chips are sandwiched between the retainer body 124 and the cover 126. A material and a form of the cover are determined so that such a sandwiching action can be realized.

As described above, the cover 126 has the opening 134. The opening 134 includes openings 134A, 134B, 134C, and 134D having a relatively large rectangular shape. In addition, the opening 134 includes slit-shape openings 134E, 134F, and 134G, and further includes cut-in-shape openings 134H and 134I. More specifically, the opening 134E is provided between the openings 134A and 134B as a groove connecting these openings, the opening 134F is provided between the openings 134B and 134C as a groove connecting these openings, and the opening 134G is provided between the openings 134C and 134D as a groove connecting these openings. The opening 134H is continuous on an outer side of the opening 134A (left side in FIG. 14), and the opening 134I is continuous on an outer side of the opening 134D (right side in FIG. 14).

The openings 134A, 134B, 134C, and 134D allow the electron beam and light to pass through. The opening 134 as a whole functions as a slit formed at a center of the cover 126. With this configuration, the cover 126 acts similarly to a leaf spring, and each sample chip can be elastically pressed down. The form of the cover in the natural state is determined so that such an action is realized.

The retainer body 124 has long-length-side walls 135 and 136, and short-length-side walls 138 and 140, and an outer frame is formed by these walls. A passage 142 for allowing the cover 126 to pass through is formed on the long-length-side wall 135, and a passage 144 into which an end of the cover 126 is inserted is formed on the long-length-side wall 136. The protruding piece 130 of the retainer body 124 has a positioning hole 130A which functions when the retainer body 124 is held.

FIG. 15 shows a state in which four sample chips 150 are stored in the retainer body 124, and are covered by the cover 126. The four sample chips 150 are sandwiched between a bottom surface plate 152 of the retainer body 124 and the cover 126. It should be noted that the number of the sample chips to be set on the retainer is arbitrary.

FIG. 16 shows the bottom surface plate 152 of the retainer body. As described above, four sample chips 150 are sandwiched between the bottom surface plate 152 and the cover 126. Each sample chip 150 has a membrane 150a.

On the bottom surface plate 152, an opening array 160, an opening array 162, and an opening array 164 are formed. The opening array 160 is formed from four openings 160A, 160B, 160C, and 160D arranged in the x direction. Each of the openings 160A, 160B 160C, and 160D exposes the membrane of each sample chip. In other words, each of the openings 160A, 160B, 160C, and 160D functions as a window for observing the respective sample. The openings allow electron beams and light to pass through.

The opening array 162 is formed from a plurality of openings 162A, 162B, 162C, 162D, and 162E arranged in the x direction. Of these openings, the openings 162B, 162C, and 162D are long holes extending in the x direction. Each of the openings 162B, 162C, and 162D exposes two corner portions of two adjacent sample chips. At the same time, each of the openings 162B, 162C, and 162D functions as a passage through which two adjacent upthrust pins pass. Alternatively, in place of the long hole, two circular openings may be formed. The openings 162A and 162E are circular openings, and each of these openings exposes one corner portion. Each of the openings 162A and 162E functions as a passage through which one upthrust pin passes.

The opening array 164 is formed from a plurality of openings 164A, 164B, 164C, 164D, and 164E arranged in the x direction. The opening array 164 has the same form as the opening array 162, and its description will not be repeated. An opening array which functions during the thrusting-up of the four sample chips is the opening array 162. Therefore, in an alternative configuration, the opening array 164 may be omitted.

In FIG. 16, a state is shown in which a tip end portion 156 of the cover 126 is inserted into the passage 144, and in which a rear end portion 154 of the cover 126 is inserted into the passage 142.

Figure 23:
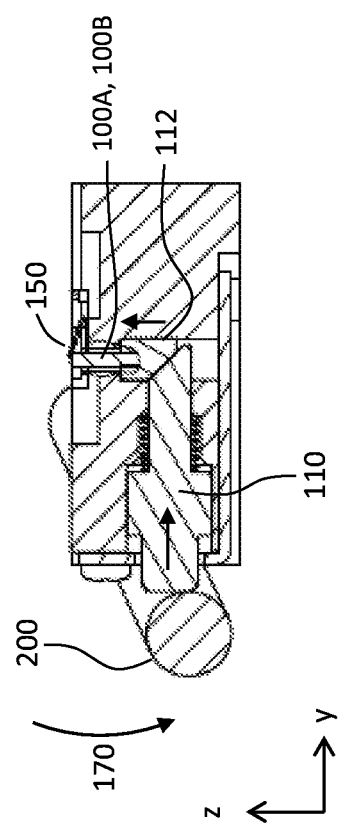
FIG. 23 is a diagram showing collective pressing-up of a plurality of sample chips.
Figure 24:
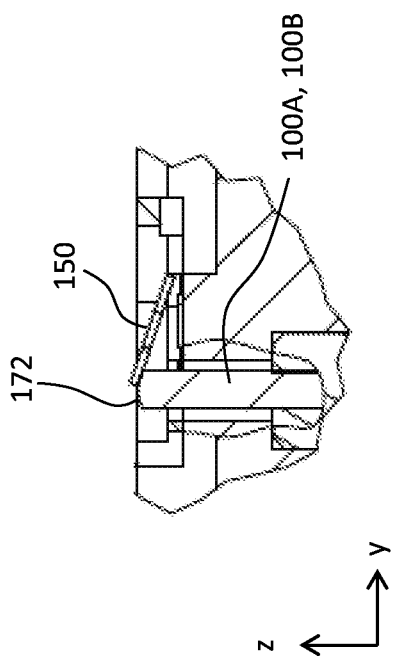
FIG. 24 is a diagram for explaining an action of a pressing-up pin.

Next, an operation or an action of the sample chip worktable according to the second embodiment will be described with reference to FIGS. 17 to 24. FIGS. 17 to 21 show processes of setting a plurality of sample chips on the retainer body, and FIGS. 22 to 24 show processes of detaching the plurality of sample chips from the retainer body.

Figure 18:
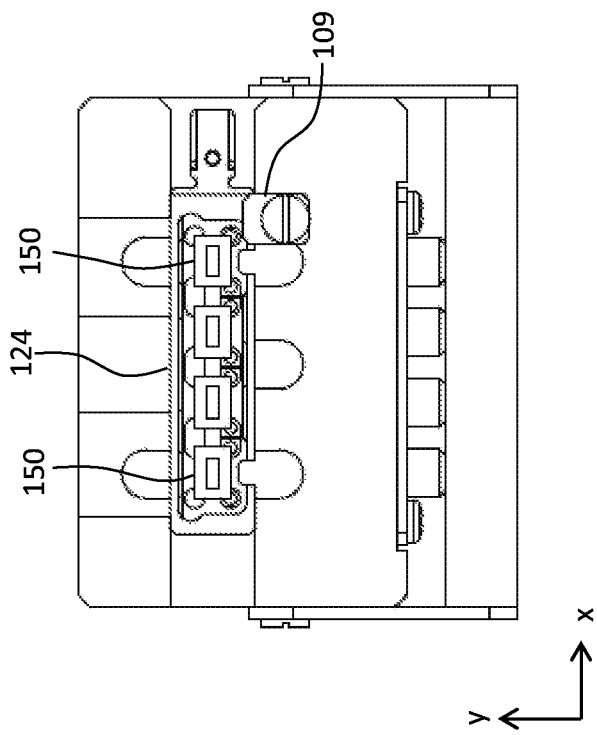
FIG. 18 is a diagram showing a state in which a plurality of sample chips are placed.
Figure 17:
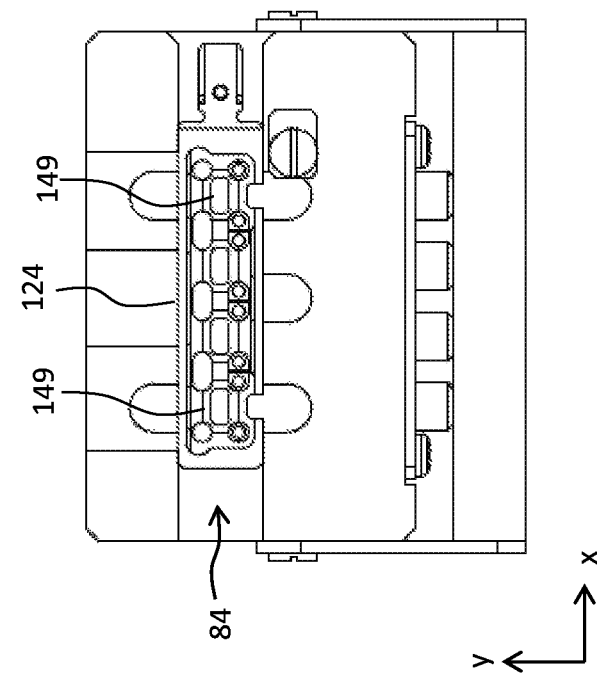
FIG. 17 is a diagram showing a state in which a retainer body is placed.
Figure 20:
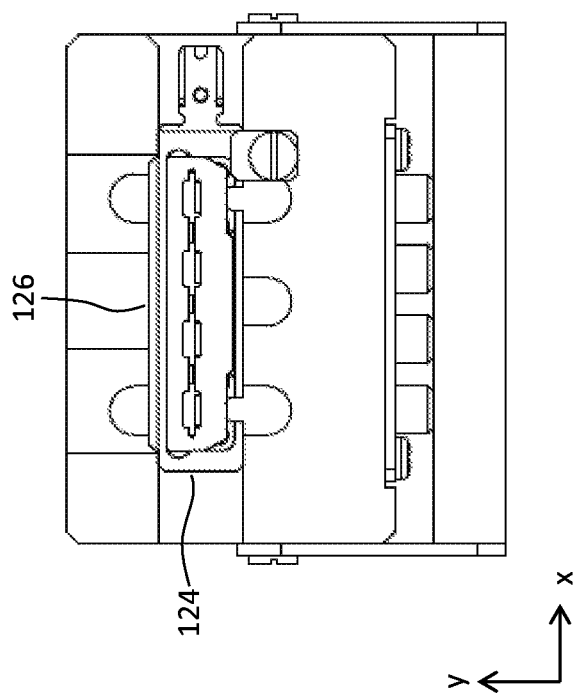
FIG. 20 is a diagram showing a state in which the cover is slid.
Figure 19:
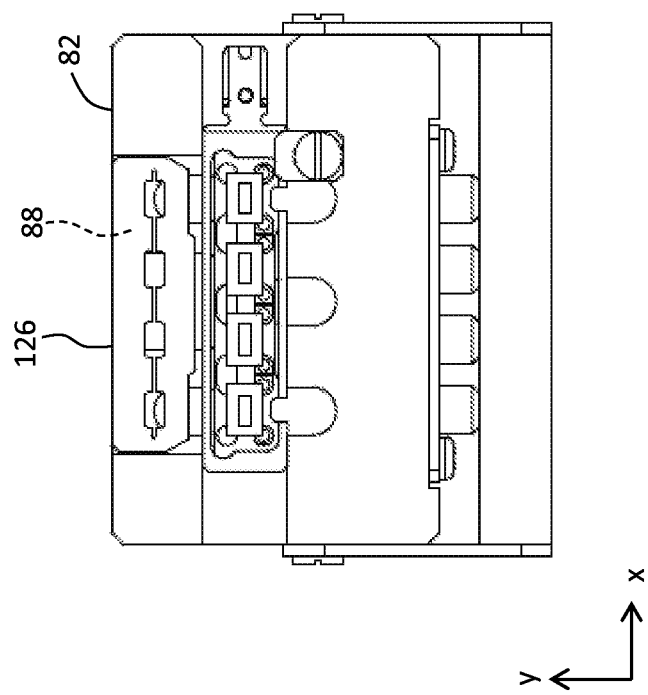
FIG. 19 is a diagram showing a state in which a cover is placed.
Figure 21:
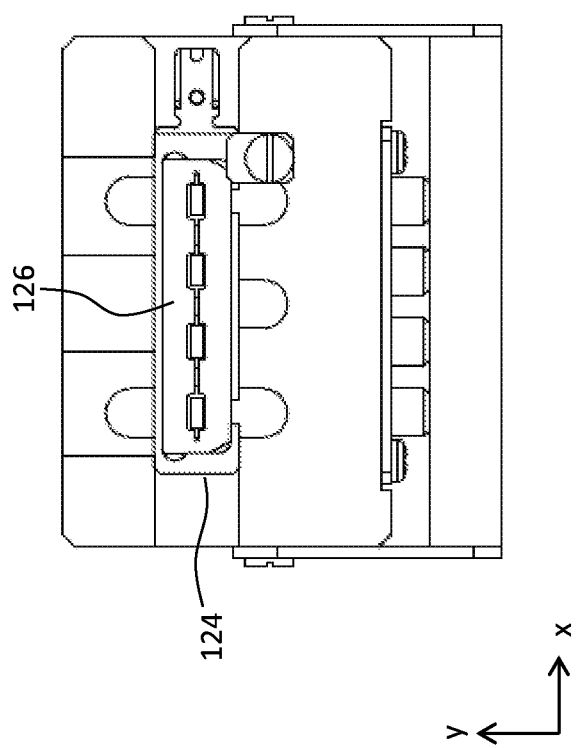
FIG. 21 is a diagram showing a state in which the sliding is completed.

As shown in FIG. 17, first, the retainer body 124 is placed in the retainer holding portion 84 of the sample chip worktable. The retainer body 124 has four chip storage portions 149. Then, as shown in FIG. 18, a state is formed in which the retainer body 124 is locked by turning of the lock plate 109. In this state, four sample chips 150 are placed with respect to the four chip storage portions. Then, as shown in FIG. 19, the cover 126 is mounted on the cover mounting surface 88 formed on the body 82. In this state, as shown in FIG. 20, the cover 126 is slid horizontally, so that the cover 126 moves to a position over the upper surface of the retainer body 124. FIG. 21 shows a state in which the retainer body 124 is completely covered by the cover 126. The four sample chips are sandwiched between the retainer body 124 and the cover 126. Then, the lock plate is rotated, and the retainer is removed from the sample chip worktable. Prior to this process or after this process, the protruding piece of the retainer is held by the retainer holding device.

Figure 22:
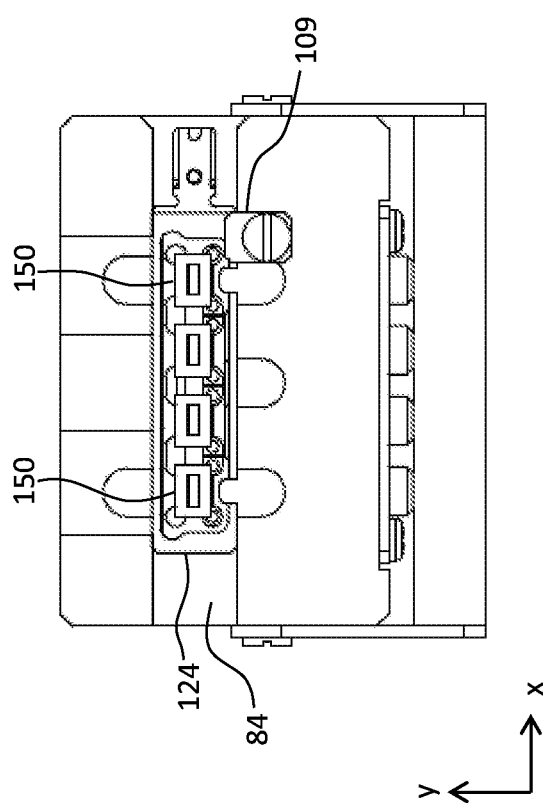
FIG. 22 is a diagram showing a state in which the cover is taken out.

FIG. 22 shows a state in which the cover over the retainer body 124 is slid and is removed. The retainer body 124 is held by the retainer holding portion 84. In addition, the rising movement of the retainer body 124 is restricted by the lock plate 109. In this state, prior to the taking out of the plurality of sample chips, the handle 200 is operated. Specifically, as shown in FIG. 23, the handle 200 is pressed downward (refer to reference numeral 170), and the four buttons are simultaneously pressed toward the deeper depth side. With this configuration, the four units operate simultaneously.

Specifically, in each unit, the operation member 110 moves in the y direction, and the horizontal movement is converted into a vertical movement. The block 112 moves upward, and the pair of upthrust pins 100A and 100B consequently move upward. With this movement, the orientation of the sample chip 150 is changed.

More specifically, as shown in FIG. 24, the pair of upthrust pins 100A and 100B thrust two corner portions on a front side of the sample chip (left side of FIG. 24) upward, and change the orientation of the sample chip 150 in the chip storage portion from the horizontal orientation to the inclined orientation. Upper ends 172 of the upthrust pins 100A and 100B have rounded shapes. The sample chip 150 having the inclined orientation is gripped by a tool such as a forceps. Alternatively, the sample chip 150 may be gripped by a fingertip. In the present embodiment, with the above-described operation of the handle, orientations of four sample chips can be simultaneously changed to the inclined orientation.

In the above-described embodiment, four sample chips are equipped on the retainer with a straight line arrangement, and an advantage can be obtained in that, even when the retainer is rotated around a center axis thereof during the sample observation, the retainer does not tend to collide with other structures. Alternatively, five or more chip storage portions may be provided in the retainer, or two or three chip storage portions may be provided in the retainer. The concept of the optical microscope in which the retainer is provided encompasses a fluorescent microscope.

The invention claimed is:

1. A sample chip worktable comprising:
a mounting surface on which a retainer is mounted, the retainer having a chip storage portion which stores a sample chip for observation under a microscope, the sample chip comprising a membrane which holds the sample, and a frame provided at a periphery of the membrane; and
a take-out support mechanism that changes an orientation of the sample chip when the sample chip is taken out from the chip storage portion,
wherein the take-out support mechanism changes the orientation of the sample chip from a horizontal orientation to an inclined orientation and causes the inclined orientation by pressing the frame of the sample chip upward.

2. The sample chip worktable according to claim 1, wherein
the take-out support mechanism comprises a pair of upthrust pins which protrude from a bottom surface of the chip storage portion and which thrust two corner portions of the frame upward.

3. The sample chip worktable according to claim 1, wherein
the take-out support mechanism comprises:
an operation member which is operated by a user; and
a pressing-up member which is moved upward by an operation force applied by the operation member, to thereby press the sample chip upward and cause the inclined orientation.

4. The sample chip worktable according to claim 1, wherein
the retainer comprises a plurality of chip storage portions which store a plurality of sample chips,
the take-out support mechanism comprises a plurality of pressing-up members provided in the plurality of chip storage portions,
the orientations of the plurality of sample chips are changed from the horizontal orientation to the inclined orientation by the plurality of pressing-up members, and
the plurality of pressing-up members operate independently from each other.

5. The sample chip worktable according to claim 4, further comprising:
a member which enables a cooperative movement of the plurality of pressing-up members.

6. The sample chip worktable according to claim 1, further comprising:
a member that restricts a rising movement of the retainer mounted on the mounting surface.

7. The sample chip worktable according to claim 1, wherein
the retainer comprises a retainer body and a cover,
after the sample chip is equipped on the retainer body mounted on the mounting surface, the retainer body is covered by the cover, so that the sample chip is sandwiched between the retainer body and the cover, and
the take-out support mechanism changes the orientation of the sample chip in a state in which the retainer body is not covered by the cover.

8. The sample chip worktable according to claim 7, wherein
a cover mounting surface is provided adjacent to the mounting surface, and
the sandwiched state of the sample chip is formed by the cover being slid from a position above the cover mounting surface to a position above the retainer body.

9. A retainer configured to be mounted on a sample chip worktable, the retainer comprising: a chip storage portion that stores a sample chip; and openings formed in the chip storage portion, the openings including at least a first opening for observation and at least a second opening arranged to allow a pressing-up member, which presses the sample chip upward to change an orientation of the sample chip, to pass, wherein the sample chip comprises a membrane which holds a sample, and a frame provided at a periphery of the membrane, the pressing-up member has two upthrust pins which thrust two corner portions of the frame upward, the at least one second opening comprises two openings corresponding to the two corner portions, and the two upthrust pins move upward through the two openings.

* * * * *